United States Patent [19]

Virupaksha et al.

[11] Patent Number: 4,501,001
[45] Date of Patent: Feb. 19, 1985

[54] VARIABLE SLOPE DELTA CODING PROCESSOR USING ADAPTIVE PREDICTION

[75] Inventors: Krishnamoorthy Virupaksha, Rockville; Samuel J. Campanella, Gaithersburg, both of Md.

[73] Assignee: Communications Satellite Corporation, Washington, D.C.

[21] Appl. No.: 439,235

[22] Filed: Nov. 4, 1982

[51] Int. Cl.³ ............................................. H03K 13/22
[52] U.S. Cl. ...................................... 375/30; 375/122; 332/11 D
[58] Field of Search ........................ 375/27, 30, 31, 32, 375/122; 340/347 AD; 358/133, 135; 381/29, 30, 31; 332/11 R, 11 D

[56] References Cited
U.S. PATENT DOCUMENTS

| | | | |
|---|---|---|---|
| 4,021,799 | 5/1977 | Hinoshita et al. | 375/30 |
| 4,267,407 | 5/1981 | Schindler et al. | 381/30 |
| 4,319,082 | 3/1982 | Gilloire et al. | 375/27 |
| 4,385,393 | 5/1983 | Chaure et al. | 375/30 |

*Primary Examiner*—Robert L. Griffin
*Assistant Examiner*—Stephen Chin

*Attorney, Agent, or Firm*—Sughrue, Mion, Zinn, Macpeak, and Seas

[57] ABSTRACT

A variable slope delta coding processor using adaptive prediction in which a digitized signal is transmitted with approximately half the channel bandwidth required by previous techniques without any substantial sacrifice of received signal quality. An estimate of a digital sample is subtracted from a digital sample of an input signal to produce an error signal. The sign bit of the error signal is transmitted as a single bit output signal. A predetermined number of immediately adjacent single bit output signals are utilized to calculate an adaptive step value using a compression technique. A set of reconstructed signal values is built up, one for each of the input signal, with each reconstructed signal value being calculated as the sum of the adaptive step size value and the estimate of the sample of the input signal. For each new sample of the input signal, an oldest reconstructed signal value is discarded and replaced by a newly calculated value. A set of predictor coefficients is built up utilizing a steepest descent algorithm. The predictor coefficients and the reconstructed signal values are convolved to obtain the estimate of the input signal sample, and the process is then repeated for the next sample of the input signal.

24 Claims, 5 Drawing Figures

FIG. 2
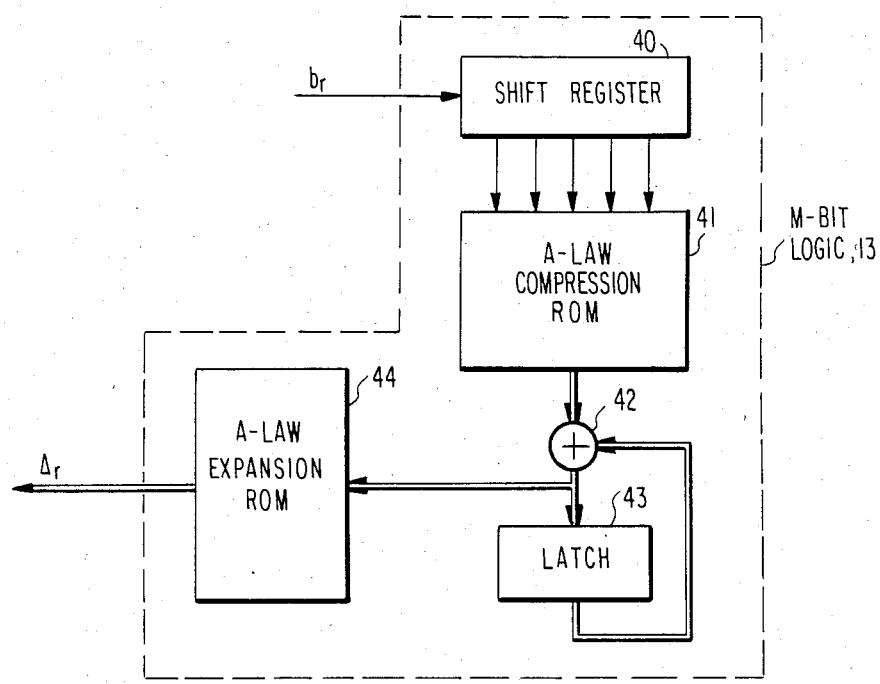
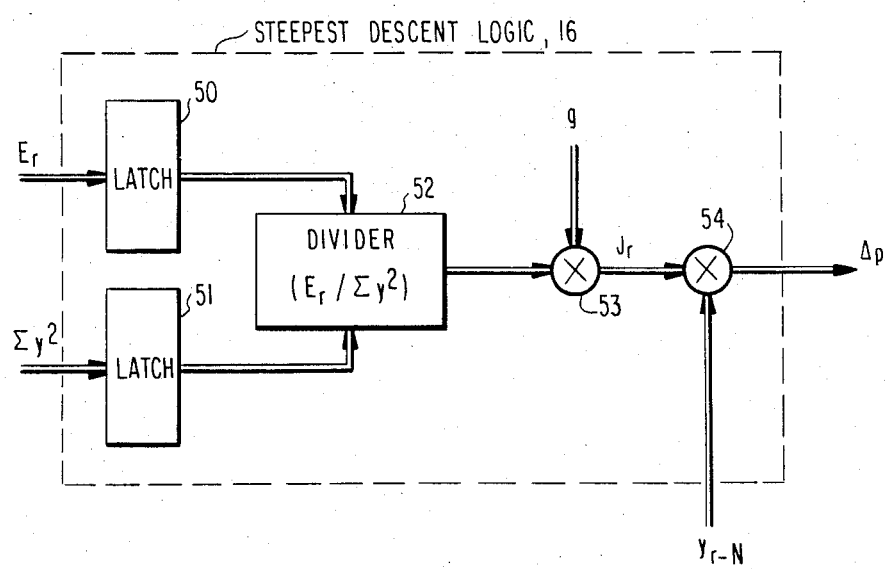
FIG. 3

VARIABLE SLOPE DELTA CODING PROCESSOR USING ADAPTIVE PREDICTION

BACKGROUND OF THE INVENTION

The invention relates generally to an adaptive processor for transmitting an input signal, for instance, an telephonic audio signal, in digital form at greatly reduced bandwidth.

To transmit an input signal composed of a series of digital samples, it is not necessary to transmit the stream of digital samples itself. For example, in a simple transmitting processor, digital values are transmitted which represent only the changes in the input signal. That is, if the input signal has a constant level over some adjacent sample, digital values representing only zero, or no digital values at all, are transmitted. Although this simple technique does achieve some significant measure of channel bandwidth rejection, nevertheless, schemes which achieve a much greater reduction in channel bandwidth are known.

In one well known technique, the input signal is compressed, such as in accordance with an A-law or a $\mu$-law compression characteristic curve prior to transmission. With these methods, the "delta" of the signal transmitted represents a smaller change in the actual signal at low signal levels than at high signal levels. Although these methods do achieve a significant increase in dynamic range, nevertheless, they are disadvantageous in that distortion in the signal is increased for high signal levels. Also, the channel bandwidth required is greater than what can be accepted in many instances.

Recently adaptive delta modulators have been developed. In these modulators, the quantizer step size is adjusted in dependence upon the level of the incoming signal, similar to the A-law and $\mu$-law compression techniques. Some specific examples of such delta modulators will now be discussed.

In an article "A Strategy for Delta Modulation and Speech Reconstruction", J. C. Su et al., *Comsat Technical Review*, Vol. 6, No. 2, Fall 1976, there is described an adaptive delta modulator utilizing an adaptive slope strategy. The adaptive slope control is incorporated into a linear delta modulation system operating at 32 kbps. The linear delta modulation system consists of a bi-state comparator in a forward loop and a two-pole, one-zero linear low-pass filter in a feedback loop. The adaptive loop slope control utilizes a variable step size which, at each sampling instant, determines the step size based on the four most recent bits obtained by sampling the comparator.

A further example is disclosed in the article "Adaptive Quantization in Differential PCM Coding of Speech", P. Cummiskey, *The Bell System Technical Journal*, Vol. 52, No. 7, September 1973. Therein is described an adaptive differential PCM coder which makes instantaneous exponential changes of a quantizer step size. The quantizer utilizes a simple first-order predictor and a time-invariant, minimally complex adaptation strategy. Step-size multipliers depend only on the most recent quantizer output, and input signals of unknown variants can be accomodated.

A residual encoder scheme is described in the article "The Residual Encoder—An Improved ADPCM System for Speech Digitization", D. L. Crone et al., *IEEE Transactions on Communications*, Vol. COM-23, No. 9, September 1975. That encoder utilizes an adaptive differential pulse-code modulation (ADPCM) system including an adaptive predictor, an adaptive quantizer, and a variable length source coding scheme. A predictor value is subtracted from a sample of an input signal and the difference supplied to a quantizer. The output of the quantizer is coded and transmitted and also passed through an inverse quantizer and predictor circuit in a feedback loop to generate the predictor coefficients.

A further example of an adaptive delta modulator is described in "Adaptive Delta Modulation with a One-Bit Memory", N. S. Jayant, *The Bell System Technical Journal*, Vol. 49, No. 3, March 1970. That article describes a delta modulator which, at every sampling instant, adapts a step size on the basis of a comparison between the two latest channel symbols. Specifically, the ratio of a modified step size to the previous step size depends of whether the two latest channel symbols are equal or not.

U.S. Pat. No. 4,071,825 to McGuffin teaches an adaptive delta modulation system in which the input analog signal is periodically compared with an analog feedback signal to generate a digital output signal. The analog feedback signal is generated from the digital output signal by generating a signal having an amplitude indicative of the absolute value of the derivative of the analog input signal, multiplying the absolute value signal by the digital output signal, and integrating the product signal.

U.S. Pat. No. 4,123,709 to Dodds et al. relates to an adaptive digital delta modulation technique in which an input analog signal is periodically sampled and a binary bit is generated for each period with the logic level of the binary bit being dependent on whether the sampled signal is greater or smaller than an approximation of the previous sample. A decoding apparatus converts the stream of binary bits to approximate the analog signal by periodically charging or discharging a capacitor integrator by predetermined variable steps. The charging or discharging of the integrator capacitor during each period is determined by the logic level of the binary bits, whereas the increase or decrease in step size for successive periods is determined by successive similar signal binary bits and successive dissimilar bits, respectively.

U.S. Pat. No. 4,208,740 to Yin et al. discloses an adaptive delta modulation system in which a compandor executes a companding algorithm having a nonlinear characteristic to provide a rapid increase or decrease in step size to follow a fast rising start or fast decaying end of talk spurt in an input signal so as to minimize slope overload distortions and to provide a small increase or decrease in step size during the smooth portion of the talk spurts in input signals to reduce any granular noise effect. The step size generated by the compander is directly related to the input signal level, providing a maximum companding range in which signal-to-noise characteristics are preserved for the soft or low voiced speaker as well as for the loud voiced speaker and providing a fast transient response suitable for most telephone applications.

Although not directly related to the field of adaptive delta modulators, the articles "Analysis of An Adaptive Impulse Response Echo Cancellor", S. J. Campanella, *Comsat Technical Review*, Vol. 2, No. 1, Spring 1972, pages 1–38 and "A Twelve-Channel Digital Echo Cancellor", D. L. Duttweiler, *IEEE Transactions on Communications*, Vol. COM-26, No. 5, 1978, pages 647–653, are of interest in disclosing techniques for computing estimates of samples of a digitized input signal. FIG. 1 of the aforementioned Campanella et al. article shows a block diagram of a digital echo cancellor in which estimates of the echo signal are computed using a convolution process. A storage register X stores a predetermined number of receive-side signal samples, while a second storage register H stores model echo path impulse responses. The values stored in the two registers are convolved to produce the estimates of the echo signal. The Duttweiler article also discloses a digital echo cancellor utilizing a convolution technique.

Although the above-described examples of adaptive delta modulators (or processors) have achieved some significant reductions in channel bandwidth while providing generally quite good received signal quality, nevertheless, due to the ever-increasing congestion of available communications channels, it is desired to provide an adaptive processor in which the channel bandwidth can be yet further reduced without greatly affecting the perceived quality of the received signal.

SUMMARY OF THE INVENTION

The invention provides a method and apparatus for transmitting and receiving an input signal, such as a telephonic audio signal, at a bandwidth reduced from that possible with prior art processors, yet without any substantial degradation of perceived received signal quality. Specifically, the invention provides a method and apparatus for transmitting such an input signal in which an adaptive step size value is computed in accordance with a predetermined number of sequential sign bits of a difference between the input signal and an estimate of the input signal. This difference signal is transmitted. A reconstructed signal sequence is calculated in accordance with the sum of the adaptive step size values and previously estimated signal values. A set of predictor coefficients is also calculated in accordance with the reconstructed signal and the sequence of the adaptive step size values. Finally, the reconstructed signal sequence is convolved with the set of predictor coefficients to obtain new values of the estimate. The adaptive step size value is determined utilizing a predetermined expansion characteristic such as a A-law or a $\mu$-law characteristic curve. To calculate the set of predictor coefficients, a set of predictor coefficient differences is first calculated utilizing a steepest descent process. The predictor coefficient differences are then summed with the predictor coefficients calculated for an immediately previous cycle, that is, for the cycle corresponding to the previous sample of the input signal to generate a current set of predictor coefficients.

More specifically, the invention provides a method for transmitting an input signal at a reduced bandwidth, and an apparatus operating in accordance with this method, wherein the method comprises the steps of subtracting an estimate of an input signal sample from the input signal sample to produce an error signal, two level quantizing the error signal to produce a single-bit output signal in accordance with the sign bit of the error signal, transmitting the single-bit output signal, providing an adaptive step size value in accordance with a predetermined number of immediately most recent values of the single-bit output signal and in accordance with a predetermined compression characteristic, multiplying the adaptive step size value by the single-bit output signal to obtain a reconstructed error signal as an approximation of the error signal, adding the value of the reconstructed error signal to the estimated signal to obtain each reconstructed signal value, storing a predetermined number of immediately most recent reconstructed signal values, discarding an oldest value and entering the most recent value and storing the reconstructed value most recently calculated, calculating a sum of squares of the stored reconstructed signal values, calculating a predetermined number of predictor coefficient differences from the sum of squares of the reconstructed signal value and of the reconstructed error signal in accordance with a predetermined steepest descent algorithm with one predictor coefficient difference being calculated for each of the reconstructed signal value, calculating a predictor coefficient for each of the predictor coefficient differences as a sum of a respective predictor coefficient difference and the previous predictor coefficient, storing the predictor coefficients, multiplying each of the predictor coefficients by a corresponding value of the reconstructed signal, summing the products thereby obtained to form the estimated signal value, and continuously repeating each of the above steps.

BRIEF DESCRIPTION OF THE DRAWINGS

FIG. 2 is a block diagram of a portion of the processor of FIG. 1, specifically, and M-bit logic circuit;

FIG. 3 is a block diagram of another portion of the processor of FIG. 1, specifically, a steepest descent logic circuit;

DESCRIPTION OF THE PREFERRED EMBODIMENTS

Figure 1:
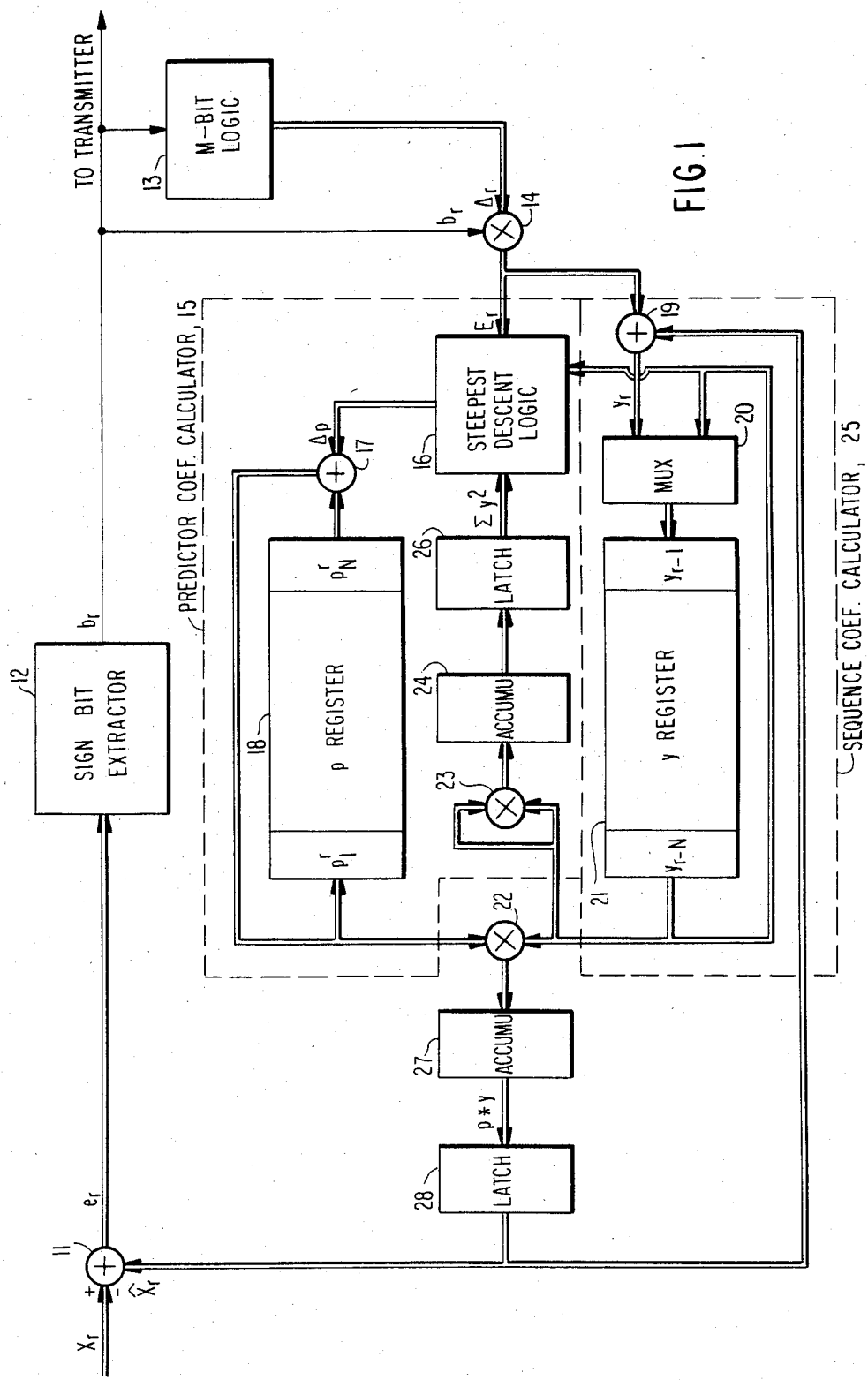
FIG. 1 is a block diagram of a variable slope delta coding transmitting processor using adaptive prediction according to the invention.

Referring first to FIG. 1, there is shown therein a detailed block diagram of a variable slope delta coding transmitting processor using adaptive prediction constructed in accordance with the present invention.

An input signal $x_r$ to be transmitted in approximated form as a binary signal is applied to one input of a digital signal subtractor 11. The input signal $x_r$ may, for example, be a telephone audio signal represented by digital samples of eight bits each. (The subscript "r" indicates the sequential number of the sample.) If the input signal is in analog form, it should of course be converted to digital form. A calculated estimate $\hat{x}_r$ of the input signal $x_r$ is applied to a subtracting input of the digital signal subtractor 11. The calculated difference $e_r = x_r - \hat{x}_r$ between these two signals is applied to a sign bit extractor circuit 12 which outputs a single bit signal $b_r$ which represents the sign of the difference. The structure of the sign bit extractor circuit 12 depends upon the format of the signal $x_r$ and $\hat{x}_r$. If two's-complement arithmetic is performed by the digital signal subtractor 11, it is possible to do away entirely with the sign bit extractor circuit 12 and simply employ a carry-out bit from the digital signal subtractor 11 as the sign bit $b_r$.

The sign bit $b_r$ is transmitted from the processor shown in FIG. 1 to the receiving side of the system. The transmission medium may be a satellite link, microwave link, coaxial cable, or any other desired digital transmission medium. It is important to note that it is only the sign $b_r$ which is transmitted and that $b_r$ has a frequency only that of the sampling frequency of the input digital signal $x_r$.

It has been experimentally determined that with the processor of the invention operating upon a telephone signal $x_r$ having eight bits/sample and a sampling frequency of 16 KHz, and accordingly with the single-bit error signal $b_r$ transmitted at a rate of 16 kilobits/sec, an output audio signal is produced at the receiving side which is subjectively very favorable comparable to an audio signal produced using the best prior art processor transmitting information at the rate of 32 kilobits/sec. That is, with the inventon, the per channel bit rate can be halved while retaining substantially the same subjective quality of audio output.

The error signal $b_r$ is also applied to an M-bit logic circuit 13 and to a multiplier 14. The M-bit logic circuit 13 produces an initial estimate $\Delta_r$ based upon a predetermined number of sequential error signal values. For instance, the value of $\Delta_r$ in a preferred implementation is calculated using a present and four immediately preceding values of the error signal $b_r$. The multiplier 14 is utilized merely to reinsert the sign bit for the present value of $\Delta_r$ to thereby provide an initial estimate $E_r$ of the next expected value of $x_r$ based upon the five preceding values of the error signal $b_r$. The signal $E_r$, which retains the same value for the entire sample period of the signal $x_r$, is applied both to a predictor coefficient calculator circuit 15 and to a reconstructed signal calculator circuit 25.

A predictor coefficient calculator circuit 15 contains a p register 18 which stores sequences of predictor coefficient values, while a reconstructed signal calculator circuit 25 contains a y register 21 in which are stored reconstructed signal values. In a preferred embodiment, the p register 18 and the y register 21 each store 16 12-bit values. Initially, the p register 18 and the y register 21 are set to the all-zeroes state. In a manner to be described, the p register 18 builds up predictor coefficient values $p_1{}^r$ to $p_n{}^r$ while, simultaneously, the y register 21 builds up sequence coefficient values $y_{r-1}$ to $y_{r-N}$. The p and y values are convolved together, during a single sample period of the input signal $x_r$, to produce the estimate $\hat{x}_r$ which is to be utilized to calculate the error signal $e_r$ and the sign bit $b_r$ for the next succeeding period of the signal $x_r$.

To compute the predictor coefficient values, a steepest descent algorithm is used. This is implemented by the steepest descent logic 16. The steepest descent logic 16, during a single period r of the input signal $x_r$, calculates 16 sequential values of predictor coefficient differences $\Delta p_i{}^r$ which are in turn used to calculate the values of $p_1{}^{r+1}$ to $p_N{}^{r+1}$ for the next succeeding period of the input signal $x_r$. Specifically, the steepest decent logic 16 calculates 16 sequential values of:

$$\Delta p_i^r = g \frac{E_r y_{r-N-1+i}}{\sum_i y_{r-i}^2},$$

for $i = 1, 2, \ldots N$.
where $N = 16$.
This is done by first calculating a single value $$J_r = g \frac{E_r}{\sum_i y_{r-i}^2}$$

once for each period r of the input signal $x_r$, storing that value of $J_r$ and sequentially forming the products $(y_{r-N-1+i}) \cdot J_r = \Delta p_i{}^r$. The value of $$\sum_i y_{r-i}^2$$

is calculated during the preceeding period $r-1$ of the input signal $x_r$ by squaring the values of $y_{r-1}$ as they are sequentially read out from the y register 21, during the convolving operation, with a multiplier 23, accumulating the squared values in an accumulator 24, and storing the final valve computed by the accumulator 24 for use by the steepest decent logic 16 in a latch 26. (The provision of the latch 26 is necessary because the output of the accumulator 24 will continue to change during the next cycle, which is when the final value from the previous cycle is needed by the steepest descent logic 16.) The details of the construction of the steepest decent logic 16 will be discussed below in conjunction with FIG. 3.

The sequential values of $\Delta p_i{}^r$ are applied to one input port of a digital adder 17, the other input port of which is connected to receive the predictor coefficient values $p_i{}^r$, which are sequentially shifted out of the p register 18. The $p_i{}^r + \Delta p_i{}^r$ sums are then applied back to the input port of the p register 18 as the predictor coefficient values $p_i{}^{r+1}$ to be used for the next period $(r+1)$ of the input signal $x_r$, and also to one input port of a multiplier 22 for the above-mentioned convolution operation.

In the y register 21 of the sequence coefficient calculator 25 are stored sequence coefficients $y_r = \hat{x}_r + E_r$. There are 16 of these values stored in the y register 21, one for each of 16 succesive periods r of the input signal $x_r$. As $e_r = x_r - \hat{x}_r$, $y_r$ may be written as $y_r = x_r - e_r + E_r$. Since $E_r$ represents the present estimate of the error in $x_r$, and $e_r$ is the actual error, it may be appreciated that $y_r$ represents the quantization error of $E_r$.

At the start of each period r of the input signal $x_r$, the oldest value $y_{r-N}$ in the y register 21 is discarded and a new value $y_{r-1}$ is calculated using the adder 19 and inputted to the first stage of the y register 21 through a multiplexer 20. After this has been done, the multiplexer 20 is set to connect the output of the y register 21 back to its input for the remainder of the operations during the period r, that is, for the convolution operation.

To perform the convolution operation, the p register 18 and y register 21 are sequentially clocked and their corresponding output values multiplied together with a multiplier 22. The product values are accumulated by an accumulator 27. The final value (p*y) held in the accumulator 27 at the end of the period r is then stored in a latch 28. This value p*y becomes $x_{r+1}$, that is, the value of $\hat{x}_r$ for the next succeeding period $r+1$.

To summarize the operations of the predictor coefficient calculator circuit 15 and the reconstructed signal value calculator circuit 25 during each period r of the input signal $x_r$, the following operations are performed:
  A. Initialization Operation:
    1. calculate $$J_r = g \frac{E_r}{\sum_i y_{r-i}^2},$$

and 2. input new value $y_{r-1}$ to y register.

B. Convolution Operation (performed 16 times):
1. calculate $\Delta p_i^r$
2. add $\Delta p_i^r$ and $p_i^r$ to form $p_i^{r+1}$
3. shift y register,
4. multiply $p_i^{r+1}$ by $y_{r-N+i}$ and accumulate,
5. compute $(y_{r-N+i})^2$ and accumulate, and
6. shift p register.

The construction of the M-bit logic 13 is shown in FIG. 2. The single bit error signal $b_r$ is fed to the serial input of a five-bit shift register 40. The shift register 40 is shifted once for each period r of the input signal $x_r$. Thus, the five most recent values of $b_r$ are outputted by the shift register 40. These five most recent values are applied to the address input of an A-law compression ROM 41, the output of which is a compressed value of the input address. If desired, another type of compression can be utilized, for instance, $\mu$-law compression. The compressed output from the compression ROM 41 is applied to one input port of the digital adder 42, the output of which is utilized to address an A-law expansion ROM 44. The output of the adder 42 is also passed to a latch 43, which stores the immediately previous value which addressed the expansion ROM 44. That is, the current address to the expansion ROM 44 is the sum of the immediately previous and present values of the five most recent bits of the error signal $b_r$. The output from the expansion ROM 44 forms the estimate $\Delta_r$.

Details of the steepest descent logic 16 are shown in FIG. 3. In this circuit, the value of $E_r$, held in a latch 50, is first divided by the value of $\Sigma y_{r-i}^2$, held in a latch 51, by a divider 52. The result is multiplied by the constant gain factor g with a multiplier 53 to thus calculate $J_r$. Multiplying by $y_{r-i}$ yields $\Delta p$.

Figure 4:
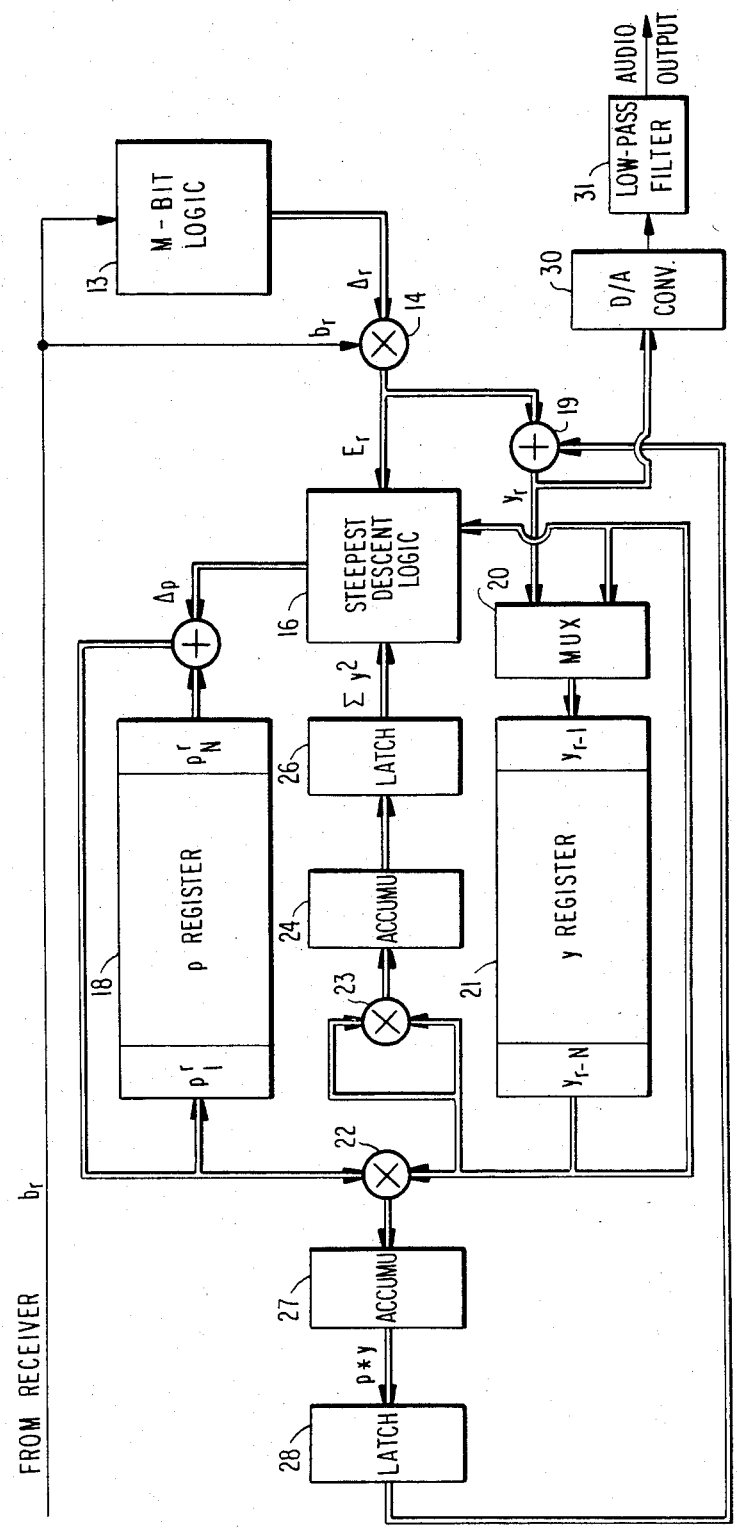
FIG. 4 is a block diagram of a variable slope delta coding receiving processor using adaptive prediction in accordance with the invention.
Figure 5:
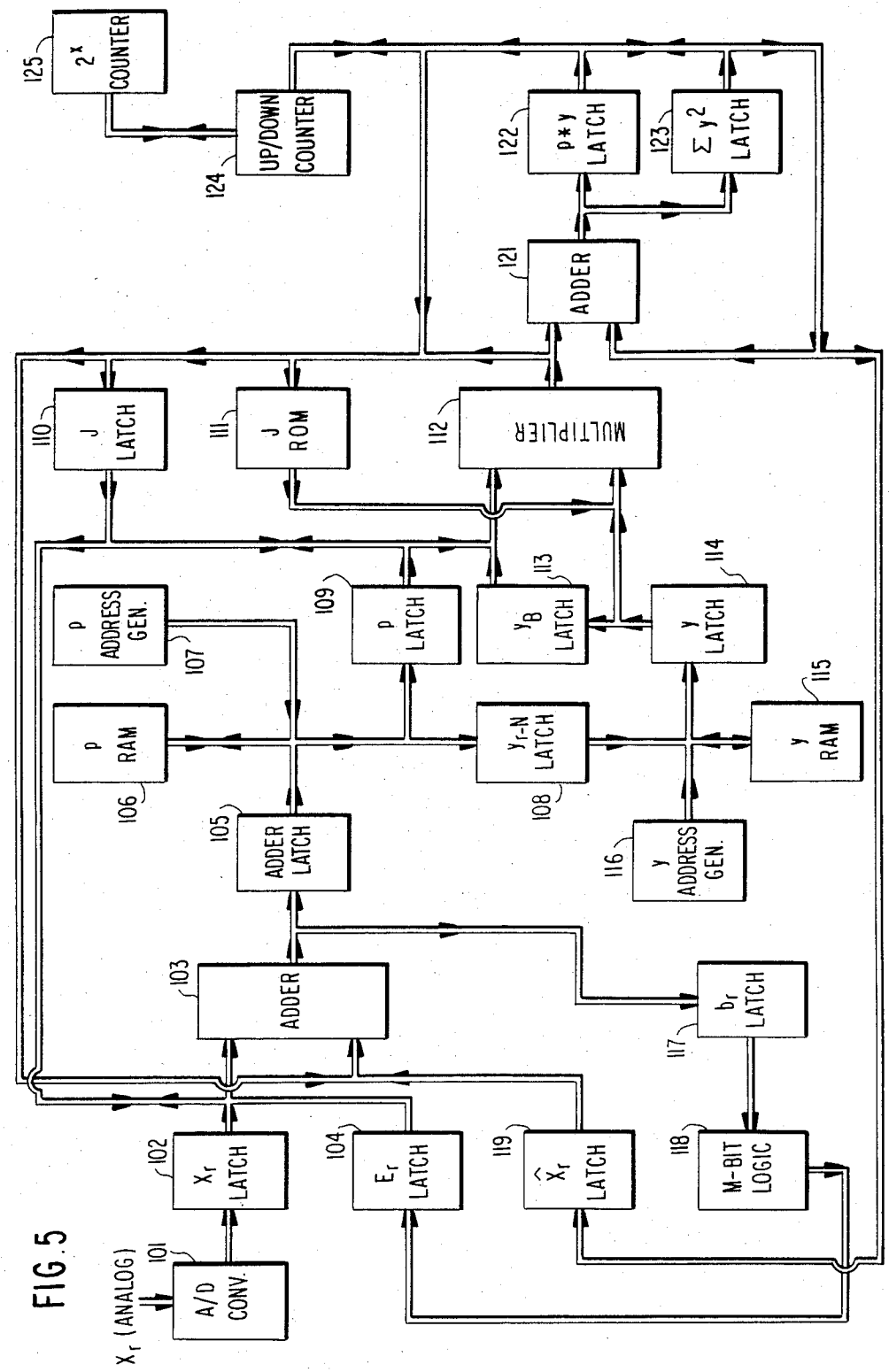
FIG. 5 is a logic diagram of a preferred implementation of the processor shown in block diagram form in FIG. 1.

Although the transmitting processor of the invention can be implemented directly as shown in FIGS. 1-4, another implementation which is saving of hardware is illustrated in FIG. 5. The implementation of FIG. 5 takes advantage of the fact that all of the various multipliers, adders and registers of the embodiment of FIG. 1 are not all in use at the same time, and thus at least some of them can be time shared.

As shown in FIG. 5, the $x_r$ signal in analog form is first applied to an analog-to-digital converter 101 to produce digital sample values of $x_r$, which are then stored in the $x_r$ latch 102. After this has been done and at the beginning of a period r, the outputs from the $x_r$ latch 102 and the $\hat{x}_r$ latch 119, in which has been stored and previously calculated value of $\hat{x}_r$, are applied to the adder 103 where they are subtracted to derive the error signal $e_r$. The carry-out bit from the adder 103 is stored in the $b_r$ latch 117. (Here, it is assumed that the value of $\hat{x}_r$ is in two's-complement form.) Next, the M-bit logic 118, which is assumed here to include the multiplier 14 and which is constructed as shown in FIG. 2 above, calculates the value of $E_r$, and that value is subsequently stored in the $E_r$ latch 104. The signals $E_r$ and $\hat{x}_r$ are then added by the adder 103 and the sum stored as $y_r$ in the $y_r$ latch 108. The then present value of $$\sum_i y_{r-i}^2$$

is enabled from a latch 123 and loaded as a preset input to an up/down counter 124. The counter 124 is then shifted leftward until the most significant bit of the value of an $$\sum_i y_{r-i}^2$$

is in the most significant bit position of the counter. The number of shifts X which are necessary to achieve this are counted and stored in a counter 125.

Following this, the eight most significant bits from the up/down counter 124 are applied to the J ROM 111 which in response outputs a value $$p_c \cong \frac{g}{\sum_i y_{r-i}^2}.$$

That is, the up/down counter 124, the shift counter 125 and the J ROM 111 together form an inverting approximation circuit with a built-in scale factor of g. The output from the $E_r$ latch 104 is again enabled and then $E_r$ is multiplied by $p_c$ which is then re-loaded into the up/down counter 124 and shifted down (to the right) by the number of shifts X previously determined by the counter 125 to obtain $J_r$. The value $J_r$ is latched in the J latch 110.

While the latter shift operation is taking place, the value of $y_{r-1}$ is read from the y RAM 115, addressed by the y address generator 116 with a corresponding address, and latched in the y latch 114. $y_{r-N}$ (i.e. $y_{r-16}$ for $N=16$) is then read into the y RAM 115 at the same address from which $y_{r-1}$ was read out. The y address generator is then advanced one count so as to address the y RAM 115 with an address corresponding to $y_{r-2}$.

The convolution operation can now begin. For the convolution operation, first $J_r$ from the latch 110 is multiplied by $y_{r-1}$ from the latch 114 using the multiplier 112 to produce a value $\Delta p_1^r$. During this operation, values of $y_{r-2}$ from the y RAM 115 and $p_1^r$ from the p RAM 106 are read out and latched in the y latch 114 and p latch 109, respectively. $p_1^r$ and $\Delta p_1^r$ are summed by the adder to produce $p_1^{r+1}$, the latter value then being written back into the p RAM 106 by the p address generator 107 for use in the next cycle r+1. The value $p_1^{r+1}$ is also stored in the p latch 109 and from there multiplied by $y_{r-2}$ from the y latch 114 by the multiplier 112. The product is accumulated in the p*y latch 122. Next $y_{r-2}$ is multiplied by itself, again using the multiplier 112, and thus the calculated value $(y_{r-2})^2$ accumulated in the $\Sigma y^2$ latch 123. The multiplication is done by first latching the value $y_{r-2}$ in the $y_B$ latch 113 (while still retaining that same value in the y latch 114) and applying $y_{r-2}$ to the multiplier 112 from the $y_B$ latch 113 and the y latch 114 simultaneously.

This is the end of the first iteration (i.e. iteration no. 1 of the sequence i=1, 2, ... N). For the next iteration, the value $y_{r-2}$ is multiplied by $J_r$ to compute $\Delta p_2^r$. $p_2^r$ is read out and added to $\Delta p_2^r$ to drive $p_2^{r+1}$. $y_{r-3}$ and $p_2^{r+1}$ are multiplied together and the product accumulated. $y_{r-3}$ is multiplied by itself and that product accumulated to complete the second iteration. This process continues until 16 iterations have been completed. The value stored in the p*y latch 28 after 16 iterations is $\hat{x}_r$. The value of $\hat{x}_r$ thus derived is used as the estimate of the next sample. This same process is carried out for each received sample.

The receiving process for receiving the binary signal from the transmitting processor of FIG. 1 is shown in block diagram form in FIG. 4, where like reference numerals designate like components. As its structure is very similar to the transmitting processor of FIG. 1 and as it can be implemented in substantially the same way (using an implementation as illustrated in FIG. 3), only the differences between it and the transmitting processor will be described.

The received binary signal $b_r$ is applied to the input of the M-bit logic 13 and the multiplier 14 as in FIG. 1. (There is no digital signal subtractor 11 in the receiving processor since $b_r$ is already an error signal.) The audio output signal is produced by performing a digital-to-analog conversion of the $y_r$ signal outputted by the adder 19.

The receiving processor can also be implemented in the manner of the transmitting processor of FIG. 5.

As mentioned previously, it has been determined using subjective tests that the quality of audio outputted by the receiving processor of the invention is as good as or nearly as good as that produced using prior art processors that require twice the channel bandwidth. Thus, the invention provides a very significant improvement in digital transmission techniques for telephone signals. Of course, the invention is not limited to use with telephone signals and can be applied equally well to other types of signals where it is desired to transmit the signal with a small bandwidth.

This completes the description of the preferred embodiments of the invention. Although preferred embodiments have been described, it is believed that numerous modifications and alterations thereto would be apparent to one of ordinary skill in the art without departing from the spirit and scope of the invention.

We claim:

1. A method for transmitting an input signal at a reduced bit rate, comprising the steps of:
   determining a difference between an input signal and an estimate of said input signal;
   transmitting as an output signal a sign bit of said difference;
   providing an adaptive step size value in accordance with a predetermined number of sequential sign bits of said difference;
   calculating a set of reconstructed signal values in accordance with sequential ones of said adaptive step size values and said estimate;
   calculating a set of predictor coefficients in accordance with said reconstructed signal values and said sequential ones of said adaptive step size values; and
   convolving said set of reconstructed signal values with said set of predictor coefficients to obtain a new value of said estimate.

2. The method of claim 1, wherein said adaptive step size value is determined in accordance with a predetermined expansion characteristic.

3. The method of claim 1, wherein said step of calculating said set of predictor coefficients for one cycle corresponding to one sample of said input signal comprises:
   calculating a set of predictor coefficient differences in accordance with a steepest descent process; and
   summing said predictor coefficient differences with a set of predictor coefficients calculated in an immediately previous cycle.

4. A method for transmitting an input signal at a reduced bit rate, comprising the steps of:
   (a) subtracting an estimate of an input signal sample from said input signal sample to produce an error signal;
   (b) extracting a sign bit of said error signal to produce a single-bit output signal corresponding to said sign bit;
   (c) transmitting said single-bit output signal;
   (d) providing an adaptive step size value in accordance with a predetermined number of immediately most recent values of said single-bit output signal and in accordance with a predetermined expansion characteristic;
   (e) multiplying said adaptive step size value by said single-bit output signal to obtain a reconstructed error signal as an approximation of said error signal;
   (f) for each value of said reconstructed error signal obtained in step (e), adding said value of said reconstructed error signal to said error signal to obtain a reconstructed signal value;
   (g) storing said reconstructed signal value together with a predetermined number of immediately most reconstructed signal value;
   (h) for each reconstructed signal value stored in step (g), discarding an oldest reconstructed signal value among the stored immediately most recent reconstructed signal values;
   (i) calculating a predetermined number of predicator coefficient differences from a sum of squares of the stored reconstructed values in a previous cycle, said reconstructed values, and said approximation of said error signal in accordance with a predetermined steepest descent process, one of said predictor coefficient differences being calculated for each of said reconstructed signal values;
   (j) calculating a predictor coefficient for each said predictor coefficient difference as a sum of a respective predictor coefficient difference and previous predictor coefficient.
   (k) storing said predictor coefficients;
   (l) multiplying each said predictor coefficient by a corresponding reconstructed signal values;
   (m) squaring each of said reconstructed signal values;
   (n) summing the products obtained in step (1) to obtain said error signal; and
   (o) summing the squared reconstructed signal values calculated in step (m) for use in step (i) in a next cycle;
   (p) repetitively repeating steps (a) to (o).

5. The method of claim 4, wherein said expansion characteristic comprises an A-law characteristic.

6. The method of claim 4, wherein said expansion characteristic comprises a $\mu$-law characteristic.

7. The method of any one of claims 4 to 6, wherein said step (d) of providing said adaptive step size value comprises:
   addressing a first memory with an address composed of said predetermined number of said immediately most recent values of said single-bit output signal, said first memory storing output values determined in accordance with said predetermined expansion characteristic;

summing an output value from said first memory with an immediately previous output value from said first memory to obtain as a sum a second address; and addressing a second memory with said second address to obtain said adaptive step size value, said second memory storing output values determined in accordance with an inverse of said predetermined expansion characteristic.

8. The method of claim 4, wherein said step (j) of calculating said predetermined number of predictor coefficient differences comprises:

for each said sample of said input signal, calculating a value $$J_r = g \frac{E_r}{\sum_i y_{r-i}^2},$$

where g is a constant gain factor, $E_r$ is said approximation of said error signal, and $$\sum_i y_{r-i}^2$$

is said sum of squares; and for each said reconstructed signal value, multiplying said reconstructed value by said value $J_r$ to obtain a corresponding predictor coefficient difference.

9. The method of claim 4, further comprising:
receiving said transmitted output signal; and
producing a reconstructed signal as an approximation of said input signal in response to the received signal.

10. The method of claim 9, wherein said step of producing said reconstructed signal comprises:

(i) providing an adaptive step size value in accordance with a predetermined number of immediately most recent values of said received signal and in accordance with a predetermined expansion characteristic;

(ii) multiplying said adaptive step size value by said received signal to obtain a reconstructed error signal;

(iii) for each value of said reconstructed error signal obtained in step (ii), adding said value of said reconstructed error signal to an error signal to obtain a reconstructed signal value;

(iv) storing said reconstructed signal value together with a predetermined number of immediately most recent reconstructed signal value;

(v) for each reconstructed signal value stored in step (iv), discarding an oldest reconstructed value among the stored immediately most reconstructed signal values;

(vi) calculating a predetermined number of predictor coefficient differences from a sum of squares of the stored reconstructed signal value calculated in a previous cycle, said reconstructed signal values, and said approximation of said error signal in accordance with a predetermined steepest descent process, one of said predictor coefficient differences being calculated for each of said reconstructed signal values;

(vii) calculating a predictor coefficient for each said predictor coefficient difference as a sum of a respective predictor coefficient difference and previous predictor coefficient;

(viii) storing said predictor coefficients;

(ix) multiplying each said predictor coefficient by a corresponding one of said reconstructed signal values;

(x) squaring each of said reconstructed signal values;

(xi) summing the products obtained in step (ix) to obtain the next estimated value;

(xii) summing the squared reconstructed signal values calculated in step (x) for use in step (vi) in a next cycle;

(xiii) converting said reconstructed signal values obtained in step (iv) to an analog level; and (xiv) repetitively repeating said steps (i) to (xiii).

11. The method of claim 10, wherein said expansion characteristic comprises an A-law characteristic.

12. A method of claim 10, wherein said expansion characteristic comprises a μ-law characteristic.

13. The method of any one of claims 10 to 12, wherein said steps (d) and (i) of providing said adaptive step size value comprises:

addressing a first memory with an address composed of said predetermined number of said immediately most recent values of said single-bit output signal, said first memory storing output values determined in accordance with said predetermined expansion characteristic;

summing an output value from said first memory with an immediately previous output value from said first memory to obtain as a sum a second address; and addressing a second memory with said second address to obtain said adaptive step size value, said second memory storing output values determined in accordance with an inverse of said predetermined expansion characteristic.

14. The method of claim 10, wherein said step (i) in claim 4 and said step (vi) in claim 10 of calculating said predetermined number of predictor coefficient differences comprises:

for each said sample, calculating a value $$J_r = g \frac{E_r}{\sum_i y_{r-i}^2},$$

where g is a constant gain factor, $E_r$ is said approximation of said error signal and $$\sum_i y_{r-i}^2$$

is said sum of squares; and for each said reconstructed signal value, multiplying said reconstructed signal value by said value $J_r$ to obtain a corresponding predictor coefficient difference.

15. A processor for transmitting an input signal at a reduced bit rate, comprising:

means for calculating a sign bit of a difference between successive samples of an input signal and corresponding estimates of said samples of said input signal;

means for providing adaptive step size values in accordance with a predetermined number of sign bits, one of said adaptive step size values being provided for each sample of said input signal;

means for calculating a set of reconstructed signal values in accordance with sequential ones of said adaptive step size value and said estimate of said input signal;

means for calculating a set of predictor coefficients in accordance with said reconstructed signal values and sequential ones of said adaptive step size value; and means for convolving said set of reconstructed signal values with said set of predictor coefficients to obtain a new value of said estimate.

16. The processor of claim 15, wherein said means for providing said adaptive step size value operates in accordance with a predetermined expansion characteristic.

17. The processor of claim 15, wherein said means for calculating said set of predictor coefficients comprises:
means for calculating a set of predictor coefficient differences in accordance with a steepest descent algorithm; and
means for summing said predictor coefficient differences with a set of predictor coefficients calculated in an immediately previous cycle corresponding to an immediately previous sample of said input signal.

18. A processor for transmitting an input signal at a reduced bit rate, comprising:
a differencing circuit for calculating a difference between a present sample of an input signal and an estimate of said present sample of said input signal to produce an error signal;
means for extracting a sign bit of said error signal to produce a single bit output signal to be transmitted;
calculating means for providing an adaptive step size value in accordance with a predetermined number of sequential bits ones of said single bit output signal and in accordance with a predetermined expansion characteristic;
first digital adder means for adding said adaptive step size value and said estimate of said present sample of input signal;
a first shift register;
a multiplexer for selecting as an input to said first shift register an output of said first adder and an output of said first shift register;
circuit means for calculating a sum of squares of each value stored in said first register;
steepest descent logic means for calculating a predictor coefficient difference in accordance with said adaptive step size, said output from said first shift register and said sum of squares;
a second shift register;
a second adder for adding said predictor coefficient difference calculated by said steepest descent logic means and an output from said second shift register, an output of said second adder being coupled to an input of said second shift register;
a multiplier having first and second inputs coupled to said output of said second adder and said output of said first shift register, respectively; and
accumulator means for accumulating products produced at an output of said multiplier for thereby calculating a result of convolving predictor coefficients calculated at said output of said second adder and reconstructed signal values stored in said first shift register, said result of said convolving being applied to said differencing circuit as an estimate of a next succeeding sample of said input signal.

19. The processor of claim 18, wherein said circuit means for calculating said sum of squares comprises:
a second multiplier having first and second inputs both coupled to said output of said first shift register;
an accumulator having an input coupled to an output of said second multiplier; and
a first latch for storing an output from said accumulator.

20. The processor of claim 19, wherein said steepest descent logic means comprises:
a second latch for storing said adaptive step size value;
a third latch for storing said sum of squares;
a divider for dividing the content of said second latch by the content of said third latch;
a third multiplier for multiplying an output of said divider by a constant factor; and
a fourth multiplier for multiplying an output of said third multiplier by said output from said first shift register, an output of said fourth multiplier forming said predictor coefficient difference.

21. The processor of claim 18, wherein said circuit means for providing said adaptive step value comprises:
a single-bit third shift register receiving at an input thereof said single-bit output signal;
a first read-only memory addressed by output lines from said third shift register, said first read-only memory storing output values determined in accordance with a predetermined expansion characteristic;
a third adder receiving on one input an output from said first read-only memory;
a fifth latch having input coupled to an output of said third adder and an output coupled to a second input of said third adder; and
a second read-only memory addressed by said output of said third adder, an output of said second read-only memory forming said adaptive step size, said second read-only memory storing output values corresponding to the inverse of said predetermined expansion characteristic.

22. The processor of claim 21, wherein said expansion characteristic comprises an A-law compression characteristic.

23. The processor of claim 21, wherein said predetermined expansion characteristic comprises a $\mu$-law compression characteristic.

24. The processor of claim 18, further comprising a multiplier connected between said steepest descent logic means and said means for providing said adaptive step size value for multiplying said adaptive step size value by said single bit output signal.

* * * * *

UNITED STATES PATENT AND TRADEMARK OFFICE
CERTIFICATE OF CORRECTION

PATENT NO. : 4,501,001

DATED : February 19, 1985

INVENTOR(S) : Krishnamoorthy Virupaksha et al.

It is certified that error appears in the above-identified patent and that said Letters Patent is hereby corrected as shown below:

```
Column 1, line 62, "accomodated" to -- accommodated --.
Column 5, line 14, "inventon" to --invention--;
         line 58, "decent" to --descent--.
Column 6, line 14, "preceeding" to --preceding--;
         line 20, "decent" to --descent--;
         line 25, "decent" to --descent--.
Column 7, line 58, "and" to --the--.
Column 8, line 53, "The" to --This--.
Column 10, line 45, the "." to --;--.
```

Signed and Sealed this

Twelfth Day of November 1985

[SEAL]

Attest:

DONALD J. QUIGG

Attesting Officer

Commissioner of Patents and Trademarks